United States Patent
Son et al.

(10) Patent No.: US 11,327,589 B2
(45) Date of Patent: May 10, 2022

(54) DISPLAY DEVICE WITH EMBEDDED TOUCH SCREEN

(71) Applicant: LG Display Co., Ltd., Seoul (KR)

(72) Inventors: Sein Son, Paju-si (KR); Jinsuk Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/712,088

(22) Filed: Dec. 12, 2019

(65) Prior Publication Data

US 2020/0210006 A1 Jul. 2, 2020

(30) Foreign Application Priority Data

Dec. 28, 2018 (KR) .................. 10-2018-0172057

(51) Int. Cl.
| | |
|---|---|
| *G06F 3/041* | (2006.01) |
| *H01L 27/32* | (2006.01) |
| *G06F 3/044* | (2006.01) |
| *H01L 51/52* | (2006.01) |

(52) U.S. Cl.
CPC .......... *G06F 3/0412* (2013.01); *G06F 3/0445* (2019.05); *G06F 3/0446* (2019.05); *H01L 27/323* (2013.01); *H01L 27/3244* (2013.01); *H01L 51/5253* (2013.01)

(58) Field of Classification Search
CPC .... G06F 3/0412; G06F 3/0445; G06F 3/0446; H01L 27/323; H01L 27/3244; H01L 51/5225; H01L 51/5253
See application file for complete search history.

(56) References Cited

U.S. PATENT DOCUMENTS

| | | | |
|---|---|---|---|
| 2016/0188041 A1* | 6/2016 | Kim | G06F 3/044 345/174 |
| 2017/0075452 A1* | 3/2017 | Kim | G06F 3/0443 |
| 2017/0271421 A1* | 9/2017 | Jinbo | H01L 27/3258 |
| 2019/0102012 A1* | 4/2019 | Shi | G02F 1/133512 |
| 2020/0161398 A1* | 5/2020 | Bang | H01L 27/3279 |

* cited by examiner

*Primary Examiner* — Chanh D Nguyen
*Assistant Examiner* — Ngan T. Pham-Lu
(74) *Attorney, Agent, or Firm* — Fenwick & West LLP

(57) ABSTRACT

A display panel with an embedded touch screen and a display device comprising the display panel can decrease parasitic capacitance. The display panel with an embedded touch screen includes a light emitting element layer that is disposed on a substrate including an emission area and a non-emission area, an encapsulation layer that is disposed on the light emitting element layer, and a touch sensing layer that is disposed on the light emitting element layer. The light emitting element layer includes a first electrode that is disposed in the emission area on the substrate, a light emitting layer that is disposed on the first electrode, and a second electrode that is disposed on the light emitting layer and has an opening area provided in a part of the non-emission area.

22 Claims, 11 Drawing Sheets

DISPLAY DEVICE WITH EMBEDDED TOUCH SCREEN

CROSS-REFERENCE TO RELATED APPLICATIONS

This application claims the benefit of and priority to Republic of Korea Patent Application No. 10-2018-0172057, filed on Dec. 28, 2018, which is hereby incorporated by reference in its entirety as if fully set forth herein.

BACKGROUND

Field

The present disclosure relates to a display panel with an embedded touch screen and a display device comprising the same.

Discussion of the Related Art

With advancement in information-oriented societies, demands for display devices that display an image have increased in various types. Recently, various display devices such as a liquid crystal display (LCD) device, a plasma display panel (PDP) device, a quantum dot light emitting display (QLED), and an organic light emitting display (OLED) device have been widely utilized.

An OLED device out of such display devices employs a spontaneous emission system, has a viewing angle, a contrast ratio, and the like which are more excellent than an LCD device, and can be decreased in weight and thickness and is advantageous in power consumption because a separate backlight is not required. An OLED device can be driven with a DC low voltage, has a high response speed, and has low manufacturing costs.

Recently, an OLED device is manufactured as a display device with an embedded touch screen that can recognize a user's touch. In a display device with an embedded touch screen, touch electrodes are formed in a display panel. In this case, there is a problem in that parasitic capacitance increases due to a decrease in distance between electrodes included in light emitting elements and the touch electrodes.

SUMMARY

The present disclosure provides a display panel with an embedded touch screen and a display device that can decrease parasitic capacitance.

According to an embodiment of the present disclosure, there is provided a display panel with an embedded touch screen, including a light emitting element layer that is disposed on a substrate including an emission area and a non-emission area, an encapsulation layer that is disposed on the light emitting element layer, and a touch sensing layer that is disposed on the light emitting element layer. The light emitting element layer includes a first electrode that is disposed in the emission area on the substrate, a light emitting layer that is disposed on the first electrode, and a second electrode that is disposed on the light emitting layer and has an opening area formed in a part of the non-emission area.

According to the present disclosure, an opening area is formed in the second electrode, and the opening area of the second electrode overlaps at least one of the first touch electrode, the second touch electrode, and the connection electrode. Accordingly, it is possible to curb occurrence of parasitic capacitance between the electrodes of the touch sensing layer and the second electrode.

According to the present disclosure, by electrically connecting the second electrode to the auxiliary electrode which is formed in the non-display area, it is possible to prevent a decrease in resistance even when the opening area is formed in the second electrode.

Advantageous effects of the present disclosure are not limited to the above-mentioned advantageous effects and other advantageous effects which have not been mentioned above will be apparently understood by those skilled in the art from the following description.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

DETAILED DESCRIPTION

Figure 1:
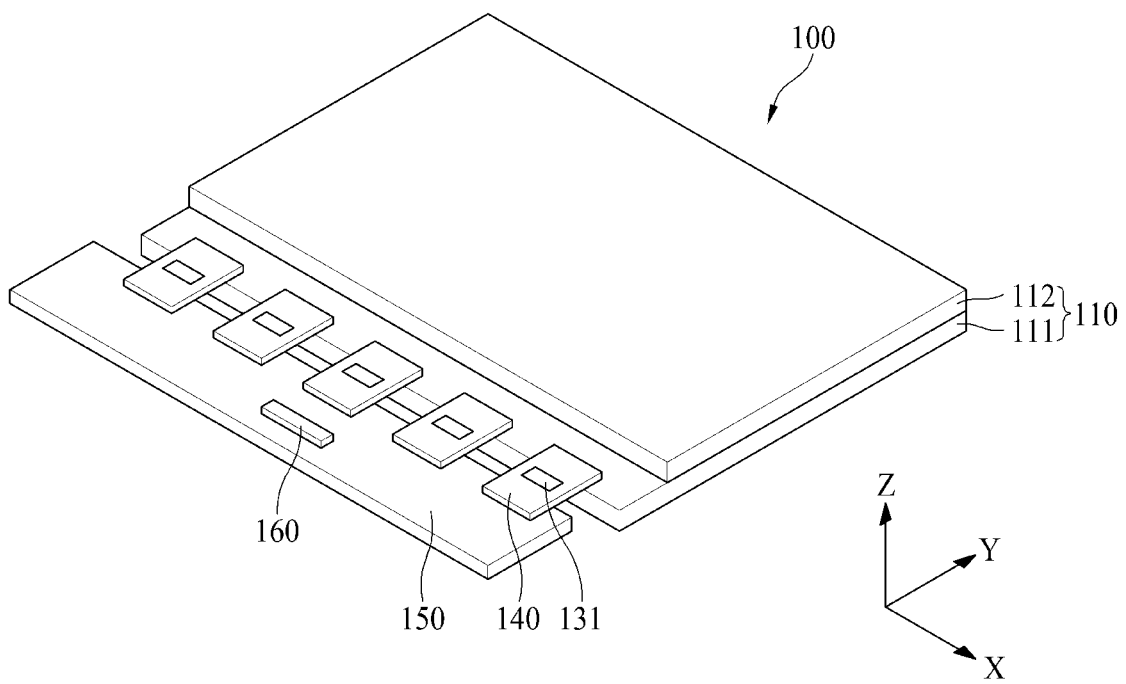
FIG. 1 is a perspective view illustrating a display device including a display panel with an embedded touch screen according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a positional relationship, for example, when a position relation between two parts is described as 'on~', 'over~', 'under~' and 'next~', one or more other parts may be disposed between the two parts unless 'just' or 'direct' is used.

In describing a temporal relationship, for example, when the temporal order is described as 'after~', 'subsequent~', 'next~', and 'before~', a case which is not continuous may be included unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

An "X-axis direction," a "Y-axis direction," and a "Z-axis direction" should not be construed as a geometric relationship in which they are perpendicular to each other and mean that they have broad directivity within the scope in which elements of the present disclosure work functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

Figure 2:
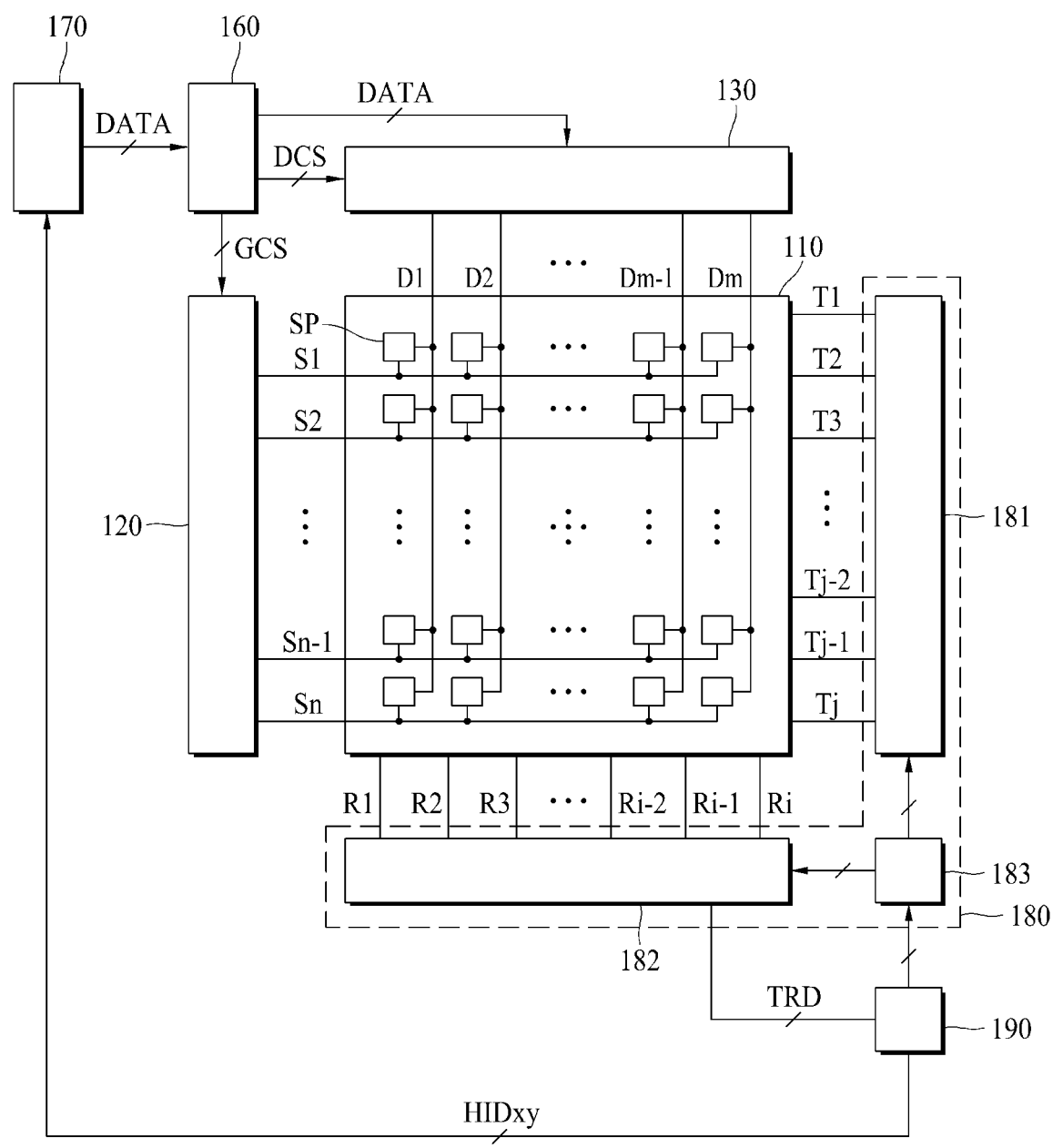
FIG. 2 is a block diagram illustrating the display device including a display panel with an embedded touch screen according to the embodiment of the present disclosure.

FIG. 1 is a perspective view illustrating a display device including a display panel with an embedded touch screen according to an embodiment of the present disclosure. FIG. 2 is a block diagram illustrating the display device including a display panel with an embedded touch screen according to the embodiment of the present disclosure.

Referring to FIGS. 1 and 2, a display device comprising a display panel with an embedded touch screen according to an embodiment of the present disclosure includes a display panel 110, a scan driving unit 120, a data driving unit 130, a timing controller 160, a host system 170, a touch driving unit 180, and a touch coordinate calculating unit 190.

The display device comprising a display panel with an embedded touch screen according to the embodiment of the present disclosure can be embodied as a flat panel display device such as a liquid crystal display (LCD) device, a field emission display (FED) device, a plasma display panel (PDP) device, an organic light emitting display (OLED) device, or an electrophoresis (EPD) device. In the following embodiments, it is assumed that the display device comprising a display panel with an embedded touch screen according to the present disclosure is embodied as an OLED device, but the present disclosure is not limited thereto.

The display panel 110 includes a first substrate 111 and a second substrate 112. The second substrate 112 may be an encapsulation substrate. The first substrate 111 may be a plastic film or a glass substrate. The second substrate 112 may be a plastic film, a glass substrate, or an encapsulation film (a protection film).

The display panel 110 includes a display area which is an area in which subpixels SP are provided and an image is displayed. Data lines D1 to Dm (where m is a positive integer equal to or greater than 2) and scan lines S1 to Sn (where n is a positive integer equal to or greater than 2) are formed on the display panel 110. The data lines D1 to Dm are formed to cross the scan lines S1 to Sn. The subpixels SP can be formed in areas which are defined by crossing structures between the scan lines and the data lines.

Each of the subpixels SP in the display panel 110 is connected to one of the data lines D1 to Dm and one of the scan lines S1 to Sn. Each of the subpixels SP in the display panel 110 includes a driving transistor that adjusts a drain-source current depending on a data voltage supplied to the gate electrode thereof, a scan transistor that is turned on in response to a scan signal of the corresponding scan line to supply a data voltage of the corresponding data line to the gate electrode of the driving transistor, an organic light emitting diode that emits light according to the drain-source current of the driving transistor, and a capacitor that stores a voltage of the gate electrode of the driving transistor. Accordingly, each subpixel SP can emit light according to a current which is supplied to the organic light emitting diode.

The scan driving unit 120 receives a scan control signal GCS from the timing controller 160. The scan driving unit 120 supplies scan signals to the scan lines S1 to Sn in response to the scan control signal GCS.

The scan driving unit 120 may be formed in a gate in panel (GIP) system in the non-display area outside one side or both sides of the display area of the display panel 110. Alternatively, the gate driving unit 120 may be manufactured as a drive chip, be mounted on a flexible film, and be attached in a tape automated bonding (TAB) system to the non-display area outside one side or both sides of the display area of the display panel 110.

The data driving unit 130 is supplied with digital video data DATA and a data control signal DCS from the timing controller 160. The data driving unit 130 converts the digital video data DATA into analog positive/negative data voltages in accordance with the data control signal DATA and supplies the analog positive/negative data voltages to the data lines. That is, pixels which are to be supplied with data voltages are selected by the scan signals from the scan driving unit 120 and the selected pixels are supplied with the data voltages.

The data driving unit 130 includes a plurality of source drive ICs 131 as illustrated in FIG. 1. Each of the plurality of source drive ICs 131 is mounted on a flexible film 140 in a chip on film (COF) or chip on plastic (COP) system. The flexible film 140 is attached to pads which are disposed in the non-display area of the display panel 110 using an anisotropic conducting film and thus the plurality of source drive ICs 131 are connected to the pads.

A circuit board 150 is attached to the flexible films 140. A plurality of circuits including drive chips are mounted on the circuit board 150. For example, the timing controller 160 may be mounted on the circuit board 150. The circuit board 150 may be a printed circuit board or a flexible printed circuit board.

The timing controller 160 is supplied with digital video data DATA and timing signals from the host system 170. The timing signals include a vertical synchronization signal, a horizontal synchronization signal, a data enable signal, and a dot clock. The vertical synchronization signal is a signal for defining one frame period. The horizontal synchronization signal is a signal for defining one horizontal period which is required for supplying data voltages to pixels in one horizontal line. The data enable signal is a signal for defining a period in which effective data is input. The dot clock is a signal which is repeated with a predetermined short period.

The timing controller 160 generates a data control signal DCS for controlling an operation timing of the data driving unit 130 and a scan control signal GCS for controlling an operation timing of the scan driving unit 120 in order to control the operation timings of the scan driving unit 120 and the data driving unit 130. The timing controller 160 outputs the scan control signal GCS to the scan driving unit 120, and outputs the digital video data DATA and the data control signal DCS to the data driving unit 130.

The host system 170 can be embodied as a navigation system, a set-top box, a DVD player, a Blu-ray player, a personal computer (PC), a home theater system, a broadcast receiver, a phone system, or the like. The host system 170 includes a system on chip (SoC) system having a scaler incorporated therein and converts digital video data DATA of an input image into a format which is suitable for display on the display panel 110. The host system 170 transmits the digital video data DATA and timing signals to the timing controller 160.

In addition to the data lines D1 to Dm and the scan lines S1 to Sn, first touch electrodes and second touch electrodes are formed in the display panel 110. The first touch electrodes are formed to cross the second touch electrodes. The first touch electrodes are connected to a first touch driving unit 181 via first touch lines T1 to Tj (where j is a positive integer equal to or greater than 2). The second touch electrodes are connected to a second touch driving unit 182 via second touch lines R1 to Ri (where i is a positive integer equal to or greater than 2). A touch sensor is formed in each intersection between the first touch electrodes and the second touch electrodes. In the embodiment of the present disclosure, the touch sensor is embodied using mutual capacitance, but is not limited thereto. details of arrangement of the first touch electrodes and second touch electrodes will be described later in conjunction with FIGS. 4 and 5.

The touch driving unit 180 supplies drive pulses to the first touch electrodes via the first touch lines T1 to Tj and senses charge changes of the touch sensors via the second touch lines R1 to Ri. That is, in FIG. 2, it is assumed that the first touch lines T1 to Tj are defined as Tx lines that supply drive pulses and the second touch lines R1 to Ri are defined as Rx lines that sense the charge changes of the touch sensors.

The touch driving unit 180 includes a first touch driving unit 181, a second touch driving unit 182, and a touch controller 183. The first touch driving unit 181, the second touch driving unit 182, and the touch controller 183 may be integrated in one read-out IC (ROIC).

The first touch driving unit 181 selects first touch lines to which drive pulses are to be output under the control of the touch controller 183 and supplies the drive pulses to the selected first touch lines. For example, the first touch driving unit 181 may sequentially supply the drive pulses to the first touch lines T1 to Tj.

The second touch driving unit 182 selects second touch lines which are to receive charge changes of the touch sensors under the control of the touch controller 183 and receives the charge changes of the touch sensors via the selected second touch lines. The second touch driving unit 182 samples the charge changes of the touch sensors received via the second touch lines R1 to Ri and converts the sampled charge changes into touch raw data TRD which is digital data.

The touch controller 183 generates a Tx setup signal for setting the first touch lines to which drive pulses are to be output from the first touch driving unit 181 and an Rx setup signal for setting the second touch lines which are to receive a touch sensor voltage from the second touch driving unit 182. The touch controller 183 generates timing control signals for controlling the operation timings of the first touch driving unit 181 and the second touch driving unit 182.

The touch coordinate calculating unit 190 is supplied with touch raw data TRD from the touch driving unit 180. The touch coordinate calculating unit 190 calculates touch coordinates using a touch coordinate calculating method and outputs touch coordinate data HIDxy including information of the calculated touch coordinates to the host system 170.

The touch coordinate calculating unit 190 can be embodied by a micro control unit MCU. The host system 170 analyzes touch coordinate data HIDxy which is input from the touch coordinate calculating unit 190 and executes an application program which is linked with the coordinates at which a user's touch occurs. The host system 170 transmits the digital video data DATA and the timing signals to the timing controller 160 in accordance with the executed application program.

The touch driving unit 180 may be included in source drive ICs 131 or may be manufactured as a separate drive chip and mounted on the circuit board 150. The touch coordinate calculating unit 190 may be manufactured as a drive chip and mounted on the circuit board 150.

Figure 3:
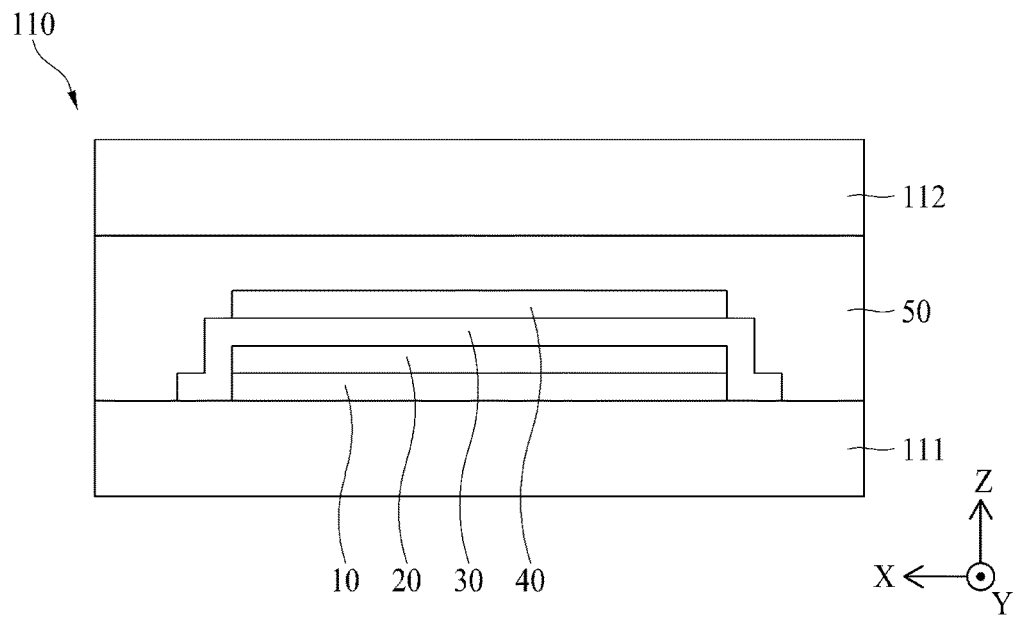
FIG. 3 is a sectional view of one side of a display panel illustrated in FIG. 1 according to an embodiment of the present disclosure.

FIG. 3 is a sectional view of one side of the display panel illustrated in FIG. 1 according to an embodiment of the present disclosure.

Referring to FIG. 3, the display panel 110 includes the first substrate 111, the second substrate 112, a thin-film transistor layer 10 that is disposed between the first and second substrates 111 and 112, a light emitting element layer 20, an encapsulation layer 30, a touch sensing layer 40, and an adhesive layer 50.

The first substrate 111 may be a plastic film or a glass substrate.

The thin-film transistor layer 10 is formed on the first substrate 111. The thin-film transistor layer 10 includes scan lines, data lines, and thin-film transistors. Each thin-film transistor includes a gate electrode, a semiconductor layer, and source and drain electrodes. When the scan driving unit is formed in a gate driver in panel (GIP) system, the scan driving unit can be formed along with the thin-film transistor layer 10. Details of the thin-film transistor layer 10 will be described later in conjunction with FIGS. 6 to 8.

The light emitting element layer 20 is formed on the thin-film transistor layer 10. The light emitting element layer 20 includes first electrodes, a light emitting layer, second electrodes, and banks. The light emitting layer may be an organic light emitting layer including an organic material. In this case, the light emitting layer includes a hole transporting layer, an organic light emitting layer, and an electron transporting layer. In this case, when a voltage is applied to the first electrode and the second electrode, holes and electrons move to the organic light emitting layer via the hole transporting layer and the electron transporting layer, respectively, and are combined in the organic light emitting layer to emit light. The light emitting element layer 20 may be a pixel array layer in which pixels are formed, and thus an area in which the light emitting element layer 20 is formed is defined as a display area. The surrounding area of the display area is defined as a non-display area. Details of the light emitting element layer 20 will be described later in conjunction with FIGS. 6 and 7.

The encapsulation layer 30 is formed on the light emitting element layer 20. The encapsulation layer 30 serves to prevent oxygen or moisture from permeating the light emitting element layer 20. The encapsulation layer 30 includes at least one inorganic film and at least one organic film. Details of a sectional structure of the encapsulation layer 30 will be described later in conjunction with FIGS. 6 to 8.

The touch sensing layer 40 is formed on the encapsulation layer 30. The touch sensing layer 40 includes first and second touch electrode layers for sensing a user's touch. The first touch electrode layer includes first touch electrodes connected to the first touch lines T1 to Tj and second touch electrodes connected to the second touch lines R1 to Ri. The second touch electrode layer includes connection electrodes that connect the first touch electrodes or the second touch electrodes. In the embodiment of the present disclosure, by forming the touch sensing layer 40 for sensing a user's touch on the encapsulation layer 30, it is not necessary to attach a touch screen device onto the display device. A planar structure of the touch sensing layer 40 will be described later in conjunction with FIGS. 4 and 5. A sectional structure of the touch sensing layer 40 will be described later in conjunction with FIGS. 6 to 8.

The adhesive layer 50 is formed on the touch sensing layer 40. The adhesive layer 50 adheres the first substrate 111 on which the thin-film transistor layer 10, the light emitting element layer 20, and the touch sensing layer 40 are formed to the second substrate 112. The adhesive layer 50 may be an optically clear resin layer (OCR) or an optically clear adhesive film (OCA).

The second substrate 112 serves as a cover substrate or a cover window that covers the first substrate 110. The second substrate 112 may be a plastic film, a glass substrate, or an encapsulation film (a protection film).

Figure 4:
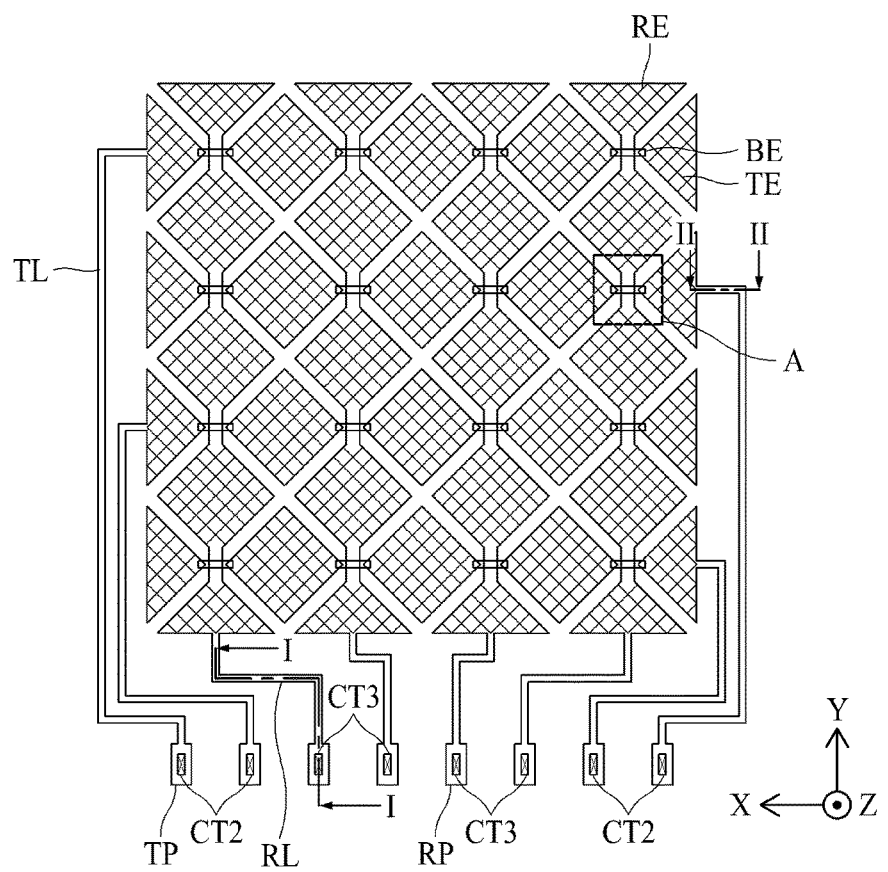
FIG. 4 is a plan view illustrating first touch electrodes and second touch electrodes, connection electrodes, and first touch lines and second touch lines of a display panel with an embedded touch screen according to the embodiment of the present disclosure.

FIG. 4 is a plan view illustrating the first touch electrodes and second touch electrodes, the connection electrodes, and the first touch lines and second touch lines of the display panel with an embedded touch screen according to the embodiment of the present disclosure.

Referring to FIG. 4, the first touch electrodes TE are arranged in a first direction (an x-axis direction) and the second touch electrodes RE are arranged in a second direction (the y-axis direction) crossing the first direction (the x-axis direction). The first direction (the x-axis direction) is a direction parallel to the scan lines S1 to Sn, and the second direction (the y-axis direction) is a direction parallel to the data lines D1 to Dm. Alternatively, the first direction (the x-axis direction) may be a direction parallel to the data lines D1 to Dm, and the second direction (the y-axis direction) may be a direction parallel to the scan lines S1 to Sn. In FIG. 4, the first touch electrodes TE and the second touch electrodes RE have a diamond-shaped planar structure, but are not limited thereto.

In order to prevent the first touch electrodes TE and the second touch electrodes RE from being short-circuited in intersection areas therebetween, the first touch electrodes TE which are adjacent to each other in the first direction (the x-axis direction) are electrically connected to each other via a connection electrode BE. Mutual capacitance corresponding to the touch sensor is formed in the intersection areas between the first touch electrodes TE and the second touch electrodes RE.

Each of the first touch electrodes TE connected in the first direction (the x-axis direction) is separated from the first touch electrodes TE which are adjacent thereto in the second direction (the y-axis direction) and thus is electrically insulated therefrom. Each of the second touch electrodes RE connected in the second direction (the y-axis direction) is separated from the second touch electrodes RE which are adjacent thereto in the first direction (the x-axis direction) and thus is electrically insulated therefrom.

The first touch electrode TE which is disposed at one end out of the first touch electrodes TE connected in the first direction (the x-axis direction) is connected to the first touch line TL. The first touch line TL is connected to the first touch driving unit 181 via a first touch pad TP. Accordingly, the first touch electrodes TE connected in the first direction (the x-axis direction) are supplied with a touch driving signal from the first touch driving unit 181 via the first touch line TL.

The second touch electrode RE which is disposed at one end out of the second touch electrodes RE connected in the second direction (the y-axis direction) is connected to the second touch line RL. The second touch line RL is connected to the second touch driving unit 182 via a second touch pad RP. Accordingly, the second touch driving unit 182 is supplied with charge changes of the touch sensors of the second touch electrodes RE connected in the second direction (the y-axis direction).

Figure 5:
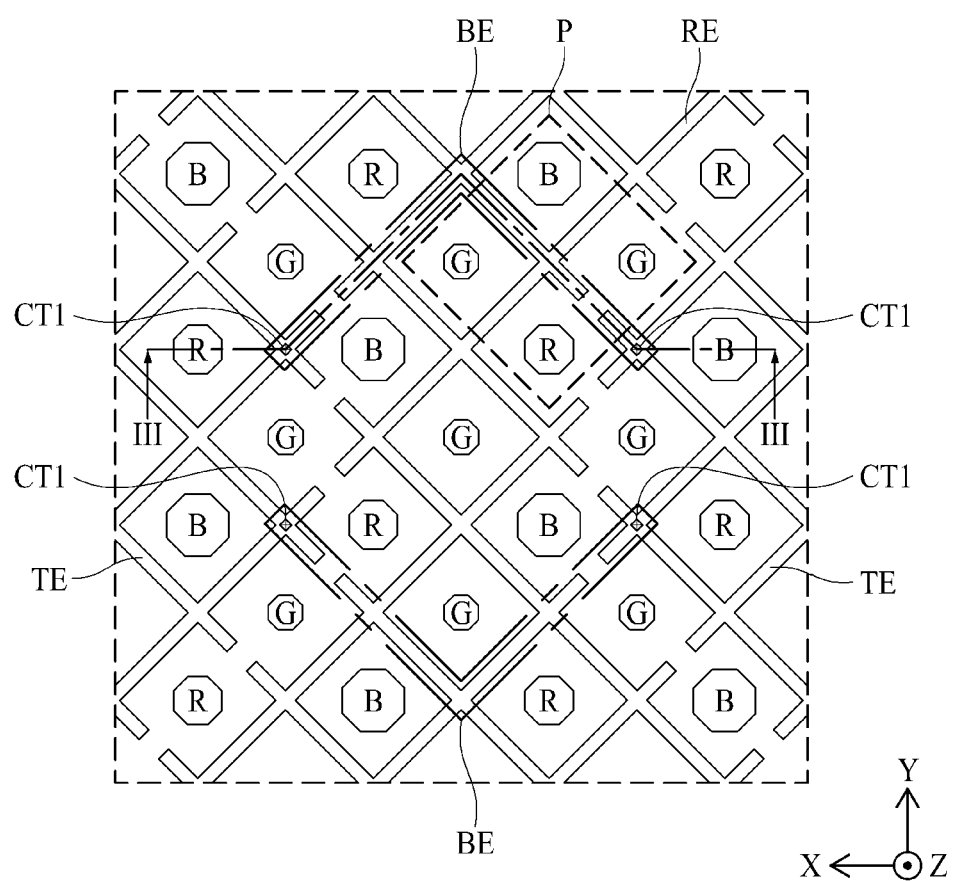
FIG. 5 is an enlarged view illustrating an example of Area A in FIG. 4 according to an embodiment of the present disclosure.

FIG. 5 is an enlarged view illustrating an example of Area A in FIG. 4 in detail according to an embodiment of the present disclosure.

Referring to FIG. 5, pixels P are formed in a pentile structure. Each pixel includes a plurality of subpixels SP and includes, for example, one red pixel R, two green pixels G, and one blue pixel B as illustrated in FIG. 5. The red pixel R, the green pixel G, and the blue pixel B are formed in an octagonal planar shape. Out of the red pixel R, the green pixel G, and the blue pixel B, the blue pixel B is the largest and the green pixel G is the smallest. In FIG. 5, the pixels P are formed in a pentile structure, but the present disclosure is not limited thereto.

The first touch electrodes TE and the second touch electrodes RE are formed in a mesh structure in order to prevent overlap with the red pixels R, the green pixels G, and the blue pixels B of the pixels P. That is, the first touch electrodes TE and the second touch electrodes RE are formed on the banks which are disposed between the red pixels R, the green pixels G, and the blue pixels B.

The first touch electrodes TE which are adjacent of each other in the first direction (the x-axis direction) are electrically connected to each other via a plurality of connection electrodes BE. The connection electrodes BE are connected to the first touch electrodes TE adjacent thereto via first contact holes CNT1 that exposes the first touch electrodes TE1. The connection electrodes BE overlap the first touch electrodes TE and the second touch electrodes RE. The connection electrodes BE are formed on the banks which are disposed between the red pixels R, the green pixels G, and the blue pixels B.

The first touch electrodes TE are formed in the same layer as the second touch electrodes RE, and the connection electrodes BE are formed in a layer different from that of the first touch electrodes TE and the second touch electrodes RE.

Figure 6:
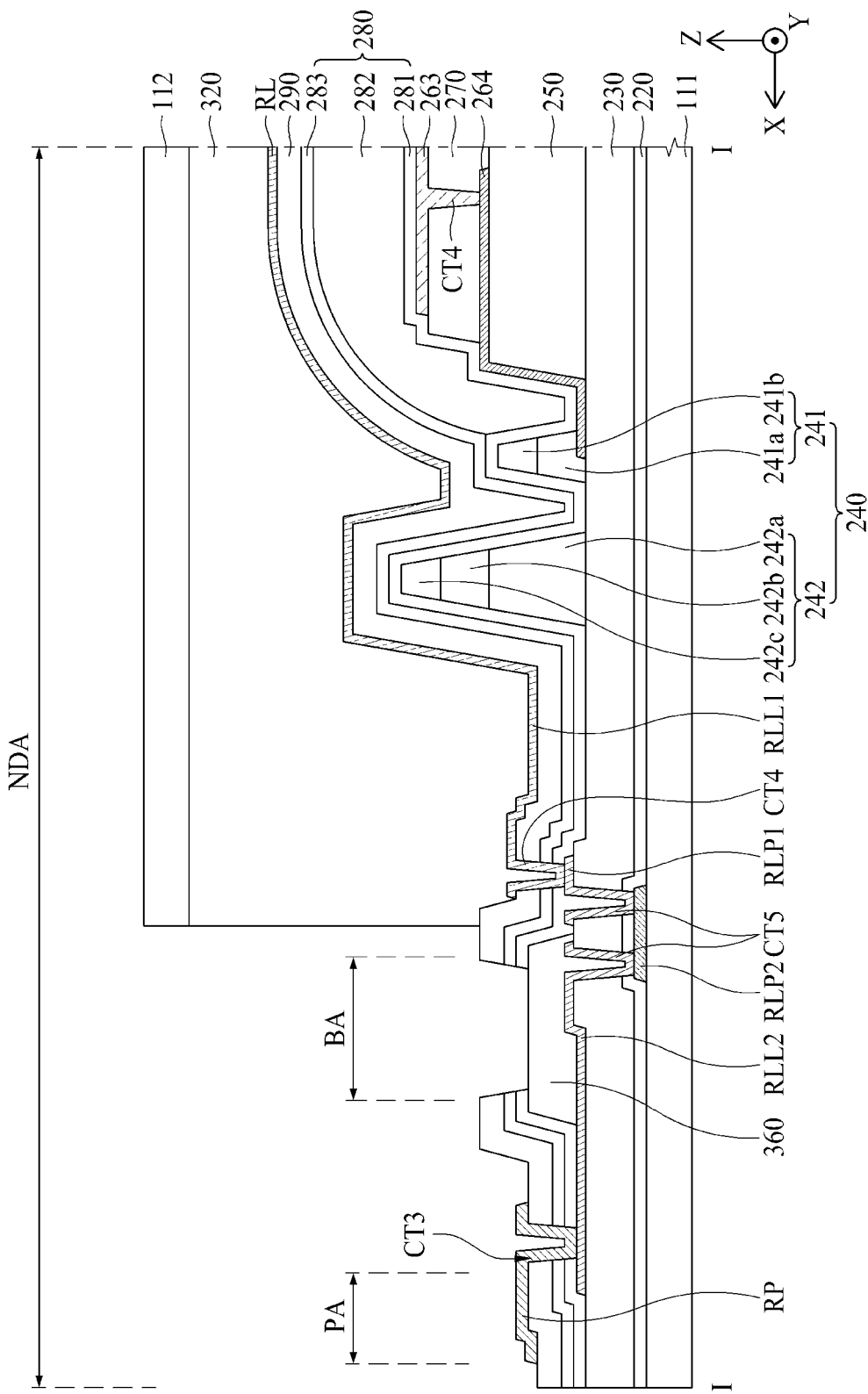
FIG. 6 is a sectional view illustrating an example taken along line I-I in FIG. 4 according to an embodiment of the present disclosure.
Figure 7:
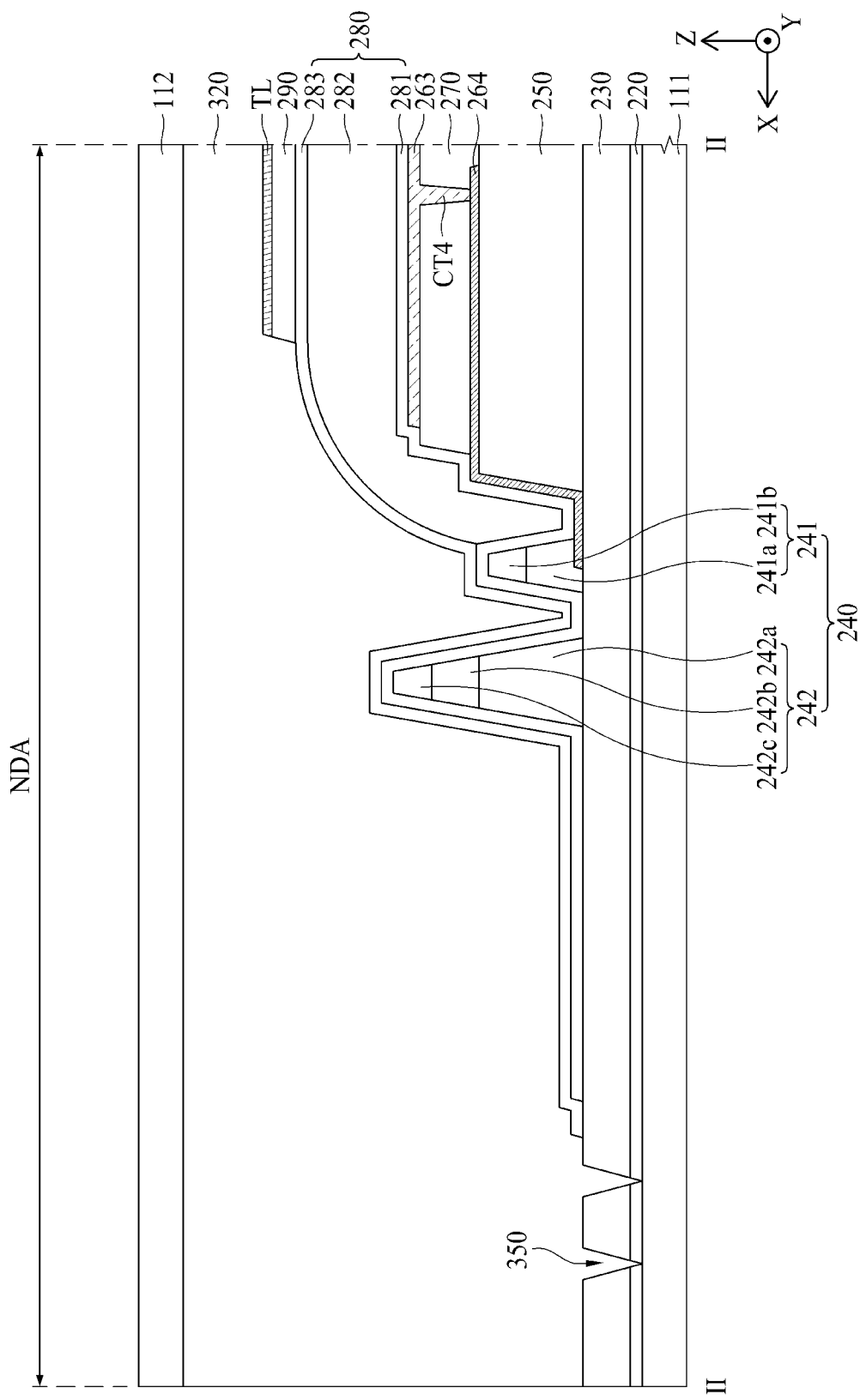
FIG. 7 is a sectional view illustrating an example taken along line II-II in FIG. 4 according to an embodiment of the present disclosure.
Figure 8:
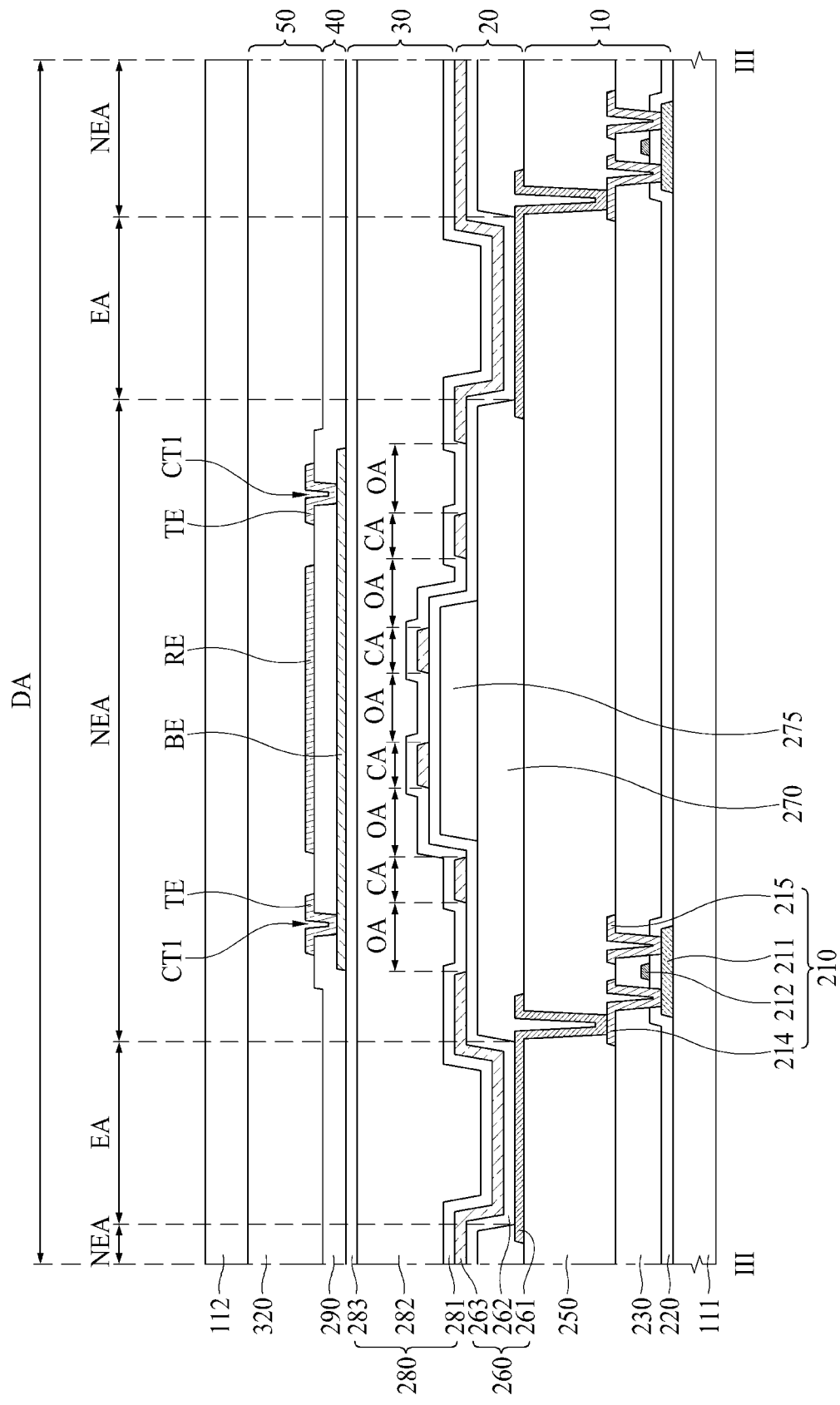
FIG. 8 is a sectional view illustrating an example taken along line III-III in FIG. 5 according to an embodiment of the present disclosure.
Figure 9:
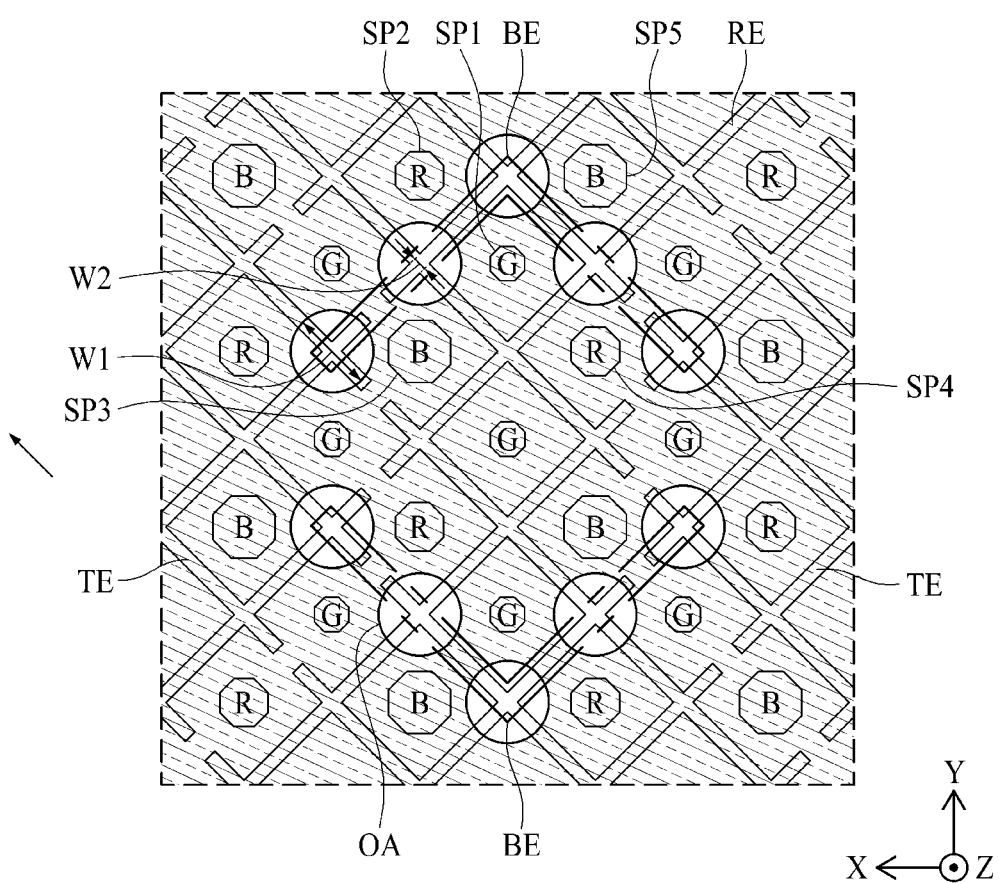
FIG. 9 is a plan view schematically illustrating an example of opening areas of second electrodes illustrated in FIG. 8.
Figure 10:
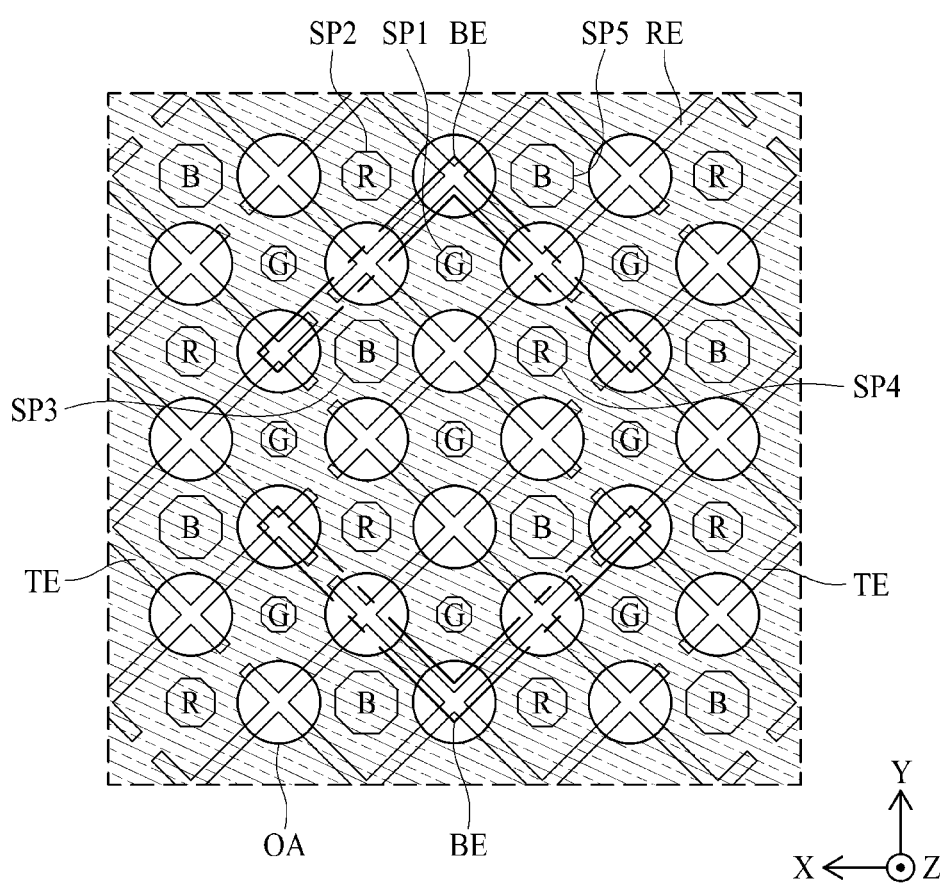
FIG. 10 is a plan view schematically illustrating another example of the opening areas of the second electrodes illustrated in FIG. 8.

FIG. 6 is a sectional view illustrating a first example taken along line I-I in FIG. 4. FIG. 7 is a sectional view illustrating a first example taken along line II-II in FIG. 4. FIG. 8 is a sectional view illustrating a first example taken along line III-III in FIG. 5. FIG. 9 is a plan view schematically illustrating an example of opening areas of the second electrodes illustrated in FIG. 8. FIG. 10 is a plan view schematically illustrating another example of the opening areas of the second electrodes illustrated in FIG. 8.

In FIG. 6, a detailed connection structure between a second touch line RL and a second touch pad RP is illustrated. In FIG. 8, a detailed connection structure between a connection electrode BE and a first touch electrode TE is illustrated.

Referring to FIGS. 6 to 8, a thin-film transistor layer 10 is formed on a first substrate 111. The thin-film transistor layer 10 includes thin-film transistors 210, a gate insulating film 220, an interlayer insulating film 230, and a planarization film 250.

A first buffer film is formed on one surface of the first substrate 111. The first buffer film is formed on one surface of the first substrate 111 to protect thin-film transistors 210 and organic light emitting elements 260 from moisture which permeates via the substrate 111 which is vulnerable to moisture. The one surface of the first substrate 111 is a surface facing the second substrate 112. The first buffer film is formed of a plurality of inorganic films which are alternately stacked. For example, the first buffer film may be formed of a multi-layered film in which one or more inorganic films of a silicon oxide film (SiOx), a silicon nitride film (SiNx), and SiON are alternately stacked. The first buffer film may be omitted.

Thin-film transistors 210 are formed on the first buffer film. Each thin-film transistor 210 includes an active layer 211, a gate electrode 212, a source electrode 214, and a drain electrode 215. In FIG. 8, the thin-film transistor 210 is formed in a top gate system in which the gate electrode 212 is located above the active layer 211, but the present disclosure is not limited thereto. That is, the thin-film transistors 210 may be formed in a bottom gate system in which the gate electrode 212 is located below the active layer 211 or a double gate system in which the gate electrode 212 is located above and below the active layer 211.

The active layer 211 is formed on the first buffer layer. The active layer 211 is formed of a silicon-based semiconductor material or an oxide-based semiconductor material. A light blocking layer that blocks external light which is incident on the active layer 211 is formed between the first buffer film and the active layer 211.

The gate insulating film 220 is formed on the active layer 211. The gate insulating film 220 may be formed of, for example, an inorganic film such as a silicon oxide film (SiOx), a silicon nitride film (SiNx), or a multi-layered film thereof.

The gate electrodes 212 and the gate lines are formed on the gate insulating film 220. The gate electrodes 212 and the gate lines may be formed of a single layer or multiple layers which are formed of one of molybdenum (Mo), aluminum (Al), chromium (Cr), gold (Au), titanium (Ti), nickel (Ni), neodymium (Nd), and copper (Cu) or an alloy thereof.

The interlayer insulating film 230 is formed on the gate electrodes 212 and the gate lines. The interlayer insulating film 230 may be formed of, for example, an inorganic film such as a silicon oxide film (SiOx), a silicon nitride film (SiNx), or a multi-layered film thereof.

The source electrodes 214, the drain electrodes 215, the data lines, the power supply lines are formed on the interlayer insulating film 230. The source electrodes 214 and the drain electrodes 215 are connected to the active layer 211 via contact holes penetrating the interlayer insulating film 230. The source electrodes 214, the drain electrodes 215, the data lines, the power supply lines are may be formed of a single layer or multiple layers which are formed of one of molybdenum (Mo), aluminum (Al), chromium (Cr), gold (Au), titanium (Ti), nickel (Ni), neodymium (Nd), and copper (Cu) or an alloy thereof.

A protection film for protecting the thin-film transistors 210 is formed on the source electrodes 214, the drain electrodes 215, the data lines, and the power supply lines. The protection film may be formed of, for example, an inorganic film such as a silicon oxide film (SiOx), a silicon nitride film (SiNx), or a multi-layered film thereof. The protection film may be omitted.

The planarization film 250 that remove step differences due to the thin-film transistors 210 is formed on the protection film. The planarization film 250 may be formed of an organic film such as an acryl resin, an epoxy resin, a phenolic resin, a polyamide resin, or a polyimide resin.

The light emitting element layer 20 is formed on the thin-film transistor layer 10. The light emitting element layer 20 includes light emitting elements 260, an auxiliary electrode 264, banks 270, and spacers 275.

The light emitting elements 260, the auxiliary electrode 264, the banks 270, and the spacers 275 are formed on the planarization film 250. Each light emitting element 260 includes a first electrode 261, an organic light emitting layer 262, and a second electrode 263. The first electrode 261 is an anode electrode and the second electrode 263 is a cathode electrode.

Each subpixel SP refers to an area in which the first electrode 261 corresponding to the anode electrode, the organic light emitting layer 262, and the second electrode 263 corresponding to the cathode electrode are sequentially stacked and holes from the first electrode 261 and electrons from the second electrode 263 are combined in the organic light emitting layer 262 to emit light.

The first electrode 261 is pattern-formed on the planarization film 250 for each pixel SP. The first electrode 261 is connected to the thin-film transistor 210. Specifically, the first electrode 261 is connected to the source electrode 214 or the drain electrode 215 of the thin-film transistor 210 via a contact hole penetrating the planarization film 250 and is supplied with a voltage for emitting light.

The first electrode 261 is formed of a conductive material having high reflectance such as a stacked structure (Ti/Al/Ti) of aluminum and titanium, a stacked structure (ITO/Al/ITO) of aluminum and ITO, an Ag alloy, or a stacked structure (ITO/Ag alloy/ITO) of an Ag alloy and ITO. The Ag alloy may be an alloy of silver (Ag), palladium (Pd), and copper (Cu).

The bank 270 is formed on the planarization film 250. The bank 270 is formed to cover an end of the first electrode 261 and to expose a part of the first electrode 261. Accordingly, the bank 270 can prevent occurrence of a problem in that a current is concentrated on the end of the first electrode 261 to degrade emission efficiency.

The bank 270 defines an emission area EA of each subpixel SP. That is, an area in which the bank 270 is not formed and the first electrode 261 is exposed in each subpixel SP is defined as an emission area EA. On the other hand, an area other than the emission area EA is defined as a non-emission area NEA.

The bank 270 may be formed of, for example, an inorganic film such as a silicon oxide film (SiOx), a silicon nitride film (SiNx), or a multi-layered film thereof, but is not limited thereto. The bank 270 may be formed of an organic film such as an acryl resin, an epoxy resin, a phenolic resin, a polyamide resin, or a polyimide resin.

The spacer 275 is formed on the bank 270. The spacer 275 may be formed of an organic film such as an acryl resin, an epoxy resin, a phenolic resin, a polyamide resin, or a polyimide resin. The spacer 275 may be omitted.

The organic light emitting layer 262 is formed on the first electrode 261, the bank 270, and the spacer 275. The organic light emitting layer 262 includes a hole transporting layer, at least one light emitting layer, and an electron transporting layer. In this case, when a voltage is applied to the first electrode 261 and the second electrode 263, holes and electrons move to the light emitting layer via the hole transporting layer and the electron transporting layer, respectively, and are combined in the light emitting layer to emit light.

The organic light emitting layer 262 includes a red light emitting layer that emits red light, a green light emitting layer that emits green light, and a blue light emitting layer that emits blue light. The red light emitting layer, the green light emitting layer, and the blue light emitting layer can be pattern-formed on the first electrode 261 for each subpixel SP. For example, a red light emitting layer is pattern-formed in a red pixel R, a green light emitting layer is pattern-formed in a green pixel G, and a blue light emitting layer is pattern-formed in a blue pixel B, but the present disclosure is not limited thereto.

Alternatively, the organic light emitting layer 262 may be a white light emitting layer that emits white light. In this case, the organic light emitting layer 262 may be a common layer which is formed commonly to the subpixels SP. The organic light emitting layer 262 may be formed in a tandem structure of two stacks or more. Each stack may include a hole transporting layer, at least one light emitting layer, and an electron transporting layer.

A charge generating layer may be formed between the stacks. The charge generating layer includes an n-type charge generating layer that is located adjacent to a lower stack and a p-type charge generating layer that is formed on the n-type charge generating layer and is located adjacent to an upper stack. The n-type charge generating layer injects electrons to the lower stack, and the p-type charge generating layer injects holes to the upper stack. The n-type charge generating layer may be formed of an organic layer which is obtained by doping an organic host material with an alkali metal such as Li, Na, K, or Cs or an alkali earth metal such as Mg, Sr, Ba, or Ra. The p-type charge generating layer may be formed of an organic layer which is obtained by doping an organic host material having hole transportability with a dopant.

The second electrode 263 is formed on the organic light emitting layer 262. The second electrode 263 may be a common layer which is formed commonly to the pixels P.

In the second electrode 263, an opening area OA that exposes a part of the spacer 275 and the bank 270 is formed in the non-emission area NEA. The opening area OA is formed to overlap at least one of the first touch electrode TE, the second touch electrode RE, and the connection electrode BE which will be described later.

For example, the opening area OA of the second electrode 263 may be formed to overlap a part of the connection electrode BE as illustrated in FIG. 9. Accordingly, since the area of an area in which the connection electrode BE and the second electrode 263 overlap each other decreases, it is possible to reduce parasitic capacitance which is formed between the connection electrode BE and the second electrode 263. On the other hand, a magnetic field of the connection electrode BE reaches a surrounding area of the connection electrode BE in addition to the area in which the connection electrode BE is formed. In consideration thereof, in the second electrode 263 according to the first embodiment of the present disclosure, a width W1 of the opening area OA is formed to be larger than a width W2 of the connection electrode BE. Accordingly, it is possible to minimize parasitic capacitance which is formed between the connection electrode BE and the second electrode 263.

In FIG. 9, the opening area OA overlaps the connection electrode BE, but is not limited thereto. When the connection electrode BE is formed under the first touch electrode TE and the second touch electrode RE, the opening area OA of the second electrode 263 is formed to overlap the connection electrode BE as illustrated in FIG. 9. In this case, the connection electrode is closer to the second electrode 263 than the first touch electrode TE and the second touch electrode RE.

For example, when the connection electrode is formed over the first touch electrode TE and the second touch electrode RE, the opening area OA of the second electrode 263 is formed to overlap the first touch electrode TE and the second touch electrode RE. In this case, the first touch electrode TE and the second touch electrode RE are closer to the second electrode 263 than the connection electrode BE.

That is, the opening area OA of the second electrode 263 can be formed to overlap an electrode which is formed closer to the second electrode 263.

For example, the opening area OA of the second electrode 263 may be formed to overlap the first touch electrode TE, the second touch electrode RE, and the connection electrode BE as illustrated in FIG. 10. Parasitic capacitance can be formed between an electrode which is formed farther from the second electrode 263 and the second electrode 263. By forming the opening area OA of the second electrode 263 to overlap the first touch electrode TE, the second touch electrode RE, and the connection electrode BE, it is possible to minimize parasitic capacitance which is formed between the electrodes of the touch sensing layer 40 and the second electrode 263.

The opening areas OA have a circular pattern as illustrated in FIGS. 9 and 10, but the present disclosure is not limited thereto. The opening areas OA may be pattern-formed in various shapes such as a quadrangular shape, a triangular shape, and a polygonal shape other than a circular shape in the non-emission area NEA.

In this case, the second electrodes 263 which are provided in the subpixels SP should be electrically connected to each other. Specifically, the second electrode 263 which is provided in one subpixel SP can be connected to the second electrodes 263 which are provided in the neighboring subpixels SP.

For example, a second subpixel SP2, a third subpixel SP3, a fourth subpixel SP4, and a fifth subpixel SP5 may be disposed adjacent to a first subpixel illustrated in FIG. 9. The second electrode 263 provided in the first subpixel SP1 and the second electrode 263 provided in the second subpixel SP2 are connected to each other via a connection area CA which is formed therebetween. Here, the connection area CA is disposed between two circular opening areas OA. The second electrode 263 provided in the first subpixel SP1 and the second electrode 263 provided in the third subpixel SP3 are connected to each other via a connection area CA which is formed therebetween. Here, the connection area CA is disposed beside one circular opening area OA. The second electrode 263 provided in the first subpixel SP1 and the second electrode 263 provided in the fourth subpixel SP4 are connected to each other via a connection area CA which is formed therebetween. Here, the connection area CA is disposed beside one circular opening area OA. The second electrode 263 provided in the first subpixel SP1 and the second electrode 263 provided in the fifth subpixel SP5 are connected to each other via a connection area CA which is formed therebetween. Here, the connection area CA is disposed between two circular opening areas OA.

The second electrode 263 can be formed of a transparent conductive material (TCO) such as ITO or IZO that can transmit light or a semi-transmissive conductive material such as magnesium (Mg), silver (Ag), or an alloy of magnesium (Mg) and silver (Ag). When the second electrode 263 is formed of a semi-transmissive conductive material, emission efficiency can be increased by micro cavities. A capping layer may be formed on the second electrode 263.

The auxiliary electrode 264 is provided in the non-display area NDA. Specifically, the auxiliary electrode 264 is provided between the display area DA and the dam 240. The auxiliary electrode 264 is formed in the same layer as the first electrode 261. Here, the auxiliary electrode 264 is separated from the first electrode 261 and is electrically insulated therefrom. The second electrode 263 is formed in the non-display area NDA as well as the display area DA and is connected to the auxiliary electrode 264 via a fourth contact hole CT4 penetrating the bank 270.

The auxiliary electrode 264 may be formed of the same material as the first electrode 261. The auxiliary electrode 264 may be formed of a conductive material having high reflectance such as a stacked structure (Ti/Al/Ti) of aluminum and titanium, a stacked structure (ITO/Al/ITO) of aluminum and ITO, an Ag alloy, or a stacked structure (ITO/Ag alloy/ITO) of an Ag alloy and ITO. The Ag alloy may be an alloy of silver (Ag), palladium (Pd), copper (Cu), and the like.

In the second electrode 263 according to the embodiment of the present disclosure, a plurality of opening areas OA are formed as described above. The area of the second electrode 263 decreases due to the plurality of opening areas OA and thus resistance thereof increases. The second electrode 263 according to the embodiment of the present disclosure is electrically connected to the auxiliary electrode 264 provided in the non-display area NDA to decrease the resistance.

The encapsulation layer 30 is formed on the light emitting element layer 20. The encapsulation layer 30 includes an encapsulation film 280 and a dam 240.

The dam 240 is formed in the non-display area NDA that surrounds the display area DA in which pixels P are arranged. The dam 240 is formed to surround the display area DA and blocks a flow of an organic film 282 forming the encapsulation film 280. The dam 240 includes a first dam 241 and a second dam 242.

The first dam 241 is formed to surround the outer periphery of the display area DA and primarily blocks a flow of the organic film 282 forming the encapsulation film 280. The first dam 241 is disposed between the display area DA and the first and second touch pads TP and RP and primarily blocks the flow of the organic film 282 such that the organic film 282 does not flow to the first and second touch pads TP and RP. A bending area BA which is bent may be formed between the display area DA and the first and second touch pads TP and RP as illustrated in FIG. 6. In this case, the first dam 241 is disposed between the display area DA and the bending area BA and primarily blocks the flow of the organic film 282 such that the organic film 282 forming the encapsulation film 280 does not flow to the bending area BA.

The first dam 241 is formed on the interlayer insulating film 230 or the auxiliary electrode 264. The first dam 241 includes a first lower layer 241a and a first upper layer 241b. The first lower layer 241a is formed on the interlayer insulating film 230 or the auxiliary electrode 264. The first upper layer 241b is formed on the first lower layer 241a.

The first lower layer 241a and the first upper layer 241b of the first dam 241 can be formed at the same time as forming the banks 270 and the spacers 275 of the pixels P out of the same material as the bank 270 and the spacer 275. For example, the first lower layer 241a of the first dam 241 can be formed of the same material as the bank 270 at the same time. The first upper layer 241b of the first dam 241 can be formed of the same material as the spacer 275 at the same time. In this case, the first lower layer 241a and the first upper layer 241b of the first dam 241 can be formed of an organic material such as an acryl resin, an epoxy resin, a phenolic resin, a polyamide resin, or a polyimide resin.

In FIGS. 6 and 7, the first dam 241 includes the first lower layer 241a and the first upper layer 241b, but the present disclosure is not limited thereto. For example, the first dam 241 may be formed in a single-layer structure of a lower layer.

The second dam 242 is formed outside of the first dam 241 and secondarily blocks the flow of the organic film 282 flowing outward over the first dam 241. Accordingly, the first dam 241 and the second dam 242 can more effectively prevent the organic film 282 from being exposed to the outside of the display panel or flowing to the first and second touch pads TP and RP.

The second dam 242 is formed on the interlayer insulating film 230. The second dam 242 includes a second lower layer 242a, an intermediate layer 242b, and a second upper layer 242c. The second lower layer 242a is formed on the interlayer insulating film 230. The intermediate layer 242b is formed on the second lower layer 242a and the second upper layer 242c is formed on the intermediate layer 242b.

The second lower layer 242a, the intermediate layer 242b, and the second upper layer 242c of the second dam 242 can be formed at the same time as at least one of the planarization film 250, the bank 270, and the spacer 275 of the pixels P out of the same material as at least one of the planarization film 250, the bank 270, and the spacer 275. For example, the second lower layer 242a of the second dam 242 may be formed of the same material as the planarization film 250 at the same time. The intermediate layer 242b of the second dam 242 may be formed of the same material as the bank 270 at the same time. The second upper layer 242c of the second dam 242 may be formed of the same material as the spacer 275 at the same time. In this case, the second lower layer 242a, the intermediate layer 242b, and the second upper layer 242c of the second dam 242 are formed of an organic material such as an acryl resin, an epoxy resin, a phenolic resin, a polyamide resin, or a polyimide resin.

In FIGS. 6 and 7, the second dam 242 includes the second lower layer 242a, the intermediate layer 242b, and the second upper layer 242c, but the present disclosure is not limited thereto. For example, the second dam 242 may be formed in a single-layer structure of a lower layer. For example, the second dam 242 may be formed in a two-layer structure of a lower layer and an upper layer.

The encapsulation film 280 is disposed on the second electrode 263, the auxiliary electrode 264, and the dam 240. The encapsulation film 280 includes at least one inorganic film and at least one organic film to prevent oxygen or moisture from permeating the organic light emitting layer 262, the second electrode 263, and the auxiliary electrode 264. For example, the encapsulation film 280 may include first and second inorganic films 281 and 283 and an organic film 282 which is interposed between the first and second inorganic films 281 and 283. Each of the first and second inorganic films 281 and 283 can be formed of silicon nitride, aluminum nitride, zirconium nitride, titanium nitride, hafnium nitride tantalum nitride, silicon oxide, aluminum oxide, or titanium oxide. The organic film 282 is formed with a thickness, for example, about 7 μm to 8 μm, sufficient to prevent particles from permeating the organic light emitting layer 262, the second electrode 263, and the auxiliary electrode 264 through the encapsulation film 280.

Since the flow of the organic film 282 is blocked by the first dam 241 and the second dam 242, the organic film 282 cannot be formed inside at least one of the first dam 241 and the second dam 242. On the other hand, the first and second inorganic films 281 and 283 can be formed outside the first dam 241 and the second dam 242. The first and second inorganic films 281 and 283 can be formed such that they do not cover the first and second touch pads TP and RP. When a bending area BA is formed, the first and second inorganic films 281 and 283 may not be formed in the bending area BA to prevent a crack from being formed at the time of bending.

On the other hand, a crack preventing groove 350 that is formed to expose the first substrate 111 may be further formed in an edge area. The crack preventing groove 350 can prevent a crack from progressing along the gate insulating film 220 and the interlayer insulating film 230 when the crack is formed in the gate insulating film 220 and the interlayer insulating film 230 due to an external impact.

The touch sensing layer 40 is formed on the encapsulation layer 30. The touch sensing layer 40 includes the first touch electrodes TE, the second touch electrodes RE, the connection electrodes BE, and a touch insulating film 290.

The first and second touch electrodes TE and RE can be formed in the same layer. The first and second touch electrodes TE and RE are separated from each other and are electrically insulated from each other. The touch insulating film 290 includes a touch insulating film and a touch organic film.

Specifically, the connection electrodes BE are formed on the encapsulation layer 30. The connection electrodes BE are formed of a single layer or multiple layers which are formed of one of molybdenum (Mo), aluminum (Al), chromium (Cr), gold (Au), titanium (Ti), nickel (Ni), neodymium (Nd), and copper (Cu) or an alloy thereof.

In FIGS. 6 to 8, the connection electrodes BE are formed directly on the second inorganic film 283 of the encapsulation film 280, but the present disclosure is not limited thereto. For example, a particular second buffer film may be formed between the second inorganic film 283 of the encapsulation film 280 and the connection electrodes BE. The second buffer film is formed to cover the encapsulation film 280 and the first and second touch pads TP and RP. The second buffer film is formed of an inorganic film or an organic film. When the second buffer film is formed of an inorganic film, the second buffer film may be formed of a silicon oxide film (SiOx), a silicon nitride film (SiNx), or a multi-layered film thereof. When the second buffer film is formed of an organic film, a plasma process may be performed on the second buffer film to increase surface roughness of the second buffer film. In this case, since the area of the second buffer film in contact with the connection electrodes BE can be increased, an interface adhesive force between the second buffer film and the connection electrodes BE.

A touch inorganic film is formed on the connection electrodes BE. The touch inorganic film is formed of, for example, a silicon oxide film (SiOx), a silicon nitride film (SiNx), or a multi-layered film thereof.

A touch organic film is formed on the touch inorganic film. Since contact holes are formed in the touch organic film, the touch organic film includes a photosensitive material. For example, the touch organic film may be formed of photo acrylate including a photosensitive material.

The touch inorganic film can prevent an organic film heaving phenomenon in which the touch organic film heaves between the connection electrodes BE and the touch organic film. The interface adhesive force between the connection electrodes BE and the touch inorganic film is greater than the interface adhesive force between the connection electrodes BE and the touch organic film. Accordingly, when the touch inorganic film is formed between the connection electrodes BE and the touch organic film, it is possible to prevent an organic film heaving phenomenon in which the touch organic film heaves between the connection electrodes BE and the touch organic film. The touch inorganic film also serves to prevent oxygen or moisture from permeating the organic light emitting layer 262 and the second electrode 263 along with the first and second inorganic films 281 and 283.

In FIGS. 6 to 8, the touch insulating film 290 includes the touch inorganic film and the touch organic film, but the present disclosure is not limited thereto. For example, the touch insulating film 290 may include one of the touch inorganic film and the touch organic film.

The first touch electrodes TE and the second touch electrodes RE are formed on the touch organic film. The first touch electrodes TE are connected to the connection electrodes BE via first contact holes CT that penetrate the touch inorganic film and the touch organic film and expose the connection electrodes BE. Accordingly, since the first touch electrodes TE are connected to each other using the connection electrodes BE in intersection areas between the first touch electrodes TE and the second touch electrodes RE, the first touch electrodes TE and the second touch electrodes RE are not short-circuited. The first and second touch electrodes TE and RE can be disposed to overlap the banks 270 in order to prevent the opening areas of the subpixels SP from decreasing.

The first touch lines TL extend from the first touch electrodes TE, and the second touch lines RL extend from the second touch electrodes RE. The first touch lines TL are connected to the first touch pads TP via second contact holes CT2 that penetrate at least one of the first and second inorganic films 281 and 283 of the encapsulation film 280 and the touch insulating film 290.

When the bending area BA is formed between the pad area PA and the display area DA, each first touch line TL extends from the display area DA to the pad area PA using at least two first touch connection lines. For example, each first touch line TL includes two first touch connection lines and two first touch connection patterns. One first touch connection line extends from the first touch electrode TE and is connected to one first touch connection pattern via a contact hole penetrating the first and second inorganic films 281 and 283 of the encapsulation film 280 and the touch insulating film 290. One first touch connection pattern is formed in the same layer as the source electrode 214 and the drain electrode 215 and is connected to the other first touch connection pattern via a contact hole penetrating the gate insulating film 220 and the interlayer insulating film 230. The other first touch connection pattern is formed in the same layer as the gate electrode 211 and is connected to the other first touch connection line via a contact hole penetrating the gate insulating film 220 and the interlayer insulating film 230. The other first touch connection line extends to the pad area PA and is connected to the first touch pad TP via the second contact hole CT2. The other first touch connection line is covered with the protection film 360 in the bending area BA. The first touch line TL passes through the bending area BA using first touch connection lines and first touch connection patterns. The first touch line TL may not be damaged when bending.

The first touch pad TP may be provided on the same layer as the first touch electrodes TE, but the present disclosure is not limited thereto. For example, the first touch pad TP may be provided on the same layer as source electrode 214 and the drain electrode 215. In this case, the first touch line TL may extend to one line from the display area DA to the pad area PA.

The second touch lines RL are connected to the second touch pads RP via third contact holes CT3 that penetrate at least one of the first and second inorganic films 281 and 283 of the encapsulation film 280 and the touch insulating film 290.

When the bending area BA is formed between the pad area PA and the display area DA, each second touch line RL extends from the display area DA to the pad area PA using at least two second touch connection lines. For example, each second touch line RL includes two second touch connection lines RLL1 and RLL2 and two second touch connection patterns RLP1 and RLP2. One first touch connection line RLL1 extends from the second touch electrode RE and is connected to one second touch connection pattern RLP1 via a fourth contact hole CT4 penetrating the first and second inorganic films 281 and 283 of the encapsulation film 280 and the touch insulating film 290. One second touch connection pattern RLP1 is formed in the same layer as the source electrode 214 and the drain electrode 215 and is connected to the other second touch connection pattern RLP2 via a fifth contact hole CT5 penetrating the gate insulating film 220 and the interlayer insulating film 230. The other second touch connection pattern RLP2 is formed in the same layer as the gate electrode 211 and is connected to the other second touch connection line RLL2 via the fifth contact hole CT5 penetrating the gate insulating film 220 and the interlayer insulating film 230. The other second touch connection line RLL2 is formed in the same layer as the source electrode 214 and the drain electrode 215, extends to the pad area PA over the bending area BA, and is connected to the second touch pad RP via the third contact hole CT3. The other second touch connection line RLL2 is covered with the protection film 360 in the bending area BA. The second touch line RL passes through the bending area BA using second touch connection lines RLL1 and RLL2 and second touch connection patterns RLP1 and RLP2. The second touch line RL may not be damaged when bending.

The second touch pad RP may be provided on the same layer as the second touch electrodes RE, but the present disclosure is not limited thereto. For example, the second touch pad RP may be provided on the same layer as source electrode 214 and the drain electrode 215. In this case, the second touch line TL may extend to one line from the display area DA to the pad area PA.

The first touch electrodes TE, the second touch electrodes RE, the first touch lines TL, and the second touch line RL are formed of a single layer or multiple layers which are formed of one of molybdenum (Mo), aluminum (Al), chromium (Cr), gold (Au), titanium (Ti), nickel (Ni), neodymium (Nd), and copper (Cu) or an alloy thereof.

On the other hand, in FIGS. 6 to 8, the connection electrodes BE are provided on the encapsulation film 280, the touch insulating film 290 is provided on the connection electrodes BE, and the first touch electrodes TE and the second touch electrodes RE are provided on the touch insulating film 290, but the present disclosure is not limited thereto. For example, the first touch electrodes TE and the second touch electrodes RE may be provided on the encapsulation film 280, the touch insulating film 290 may be provided on the first touch electrodes TE and the second touch electrodes RE, and the connection electrodes BE may be provided on the touch insulating film 290.

A color filter layer is provided on the touch sensing layer 40. The color filter layer includes color filters that are disposed to overlap the subpixels SP and black matrices that are disposed to overlap the banks 270. The color filters include a red color filter that transmits red light, a green color filter that transmits green light, and a blue color filter that transmits blue light. On the other hand, when the organic light emitting layer 262 includes a red light emitting layer that emits red light, a green light emitting layer that emits green light, and a blue light emitting layer that emits blue light, the color filter layer can be omitted.

An adhesive layer 50 is provided on the touch sensing layer 40. The adhesive layer 50 bonds the first substrate 111 in which the thin-film transistor layer 10, the organic light emitting element layer 20, the encapsulation layer 30, and the touch sensing layer 40 are provided to the second substrate 112. The adhesive layer 50 may be an optically clear resin layer OCR or an optically clear adhesive film OCA.

The second substrate 112 serves as a cover substrate or a cover window that covers the first substrate 110. The second substrate 112 may be a plastic film, a glass substrate, or an encapsulation film (a protection film).

In the display panel with an embedded touch screen according to the embodiment of the present disclosure, the opening area OA is provided in the second electrode 263. Particularly, in the display panel with an embedded touch screen according to the embodiment of the present disclosure, the opening area OA of the second electrode 263 is provided to overlap at least one of the first touch electrode TE, the second touch electrode RE, and the connection electrode BE. Accordingly, it is possible to reduce parasitic capacitance which is provided between the electrodes of the touch sensing layer 40 and the second electrode 263.

In the display panel with an embedded touch screen according to the embodiment of the present disclosure, the second electrode 263 is electrically connected to the auxiliary electrode 264 that is provided in the non-display area NDA. Accordingly, with the display panel with an embedded touch screen according to the embodiment of the present disclosure, it is possible to prevent a decrease in resistance even when the opening area OA is provided in the second electrode 263.

Figure 11:
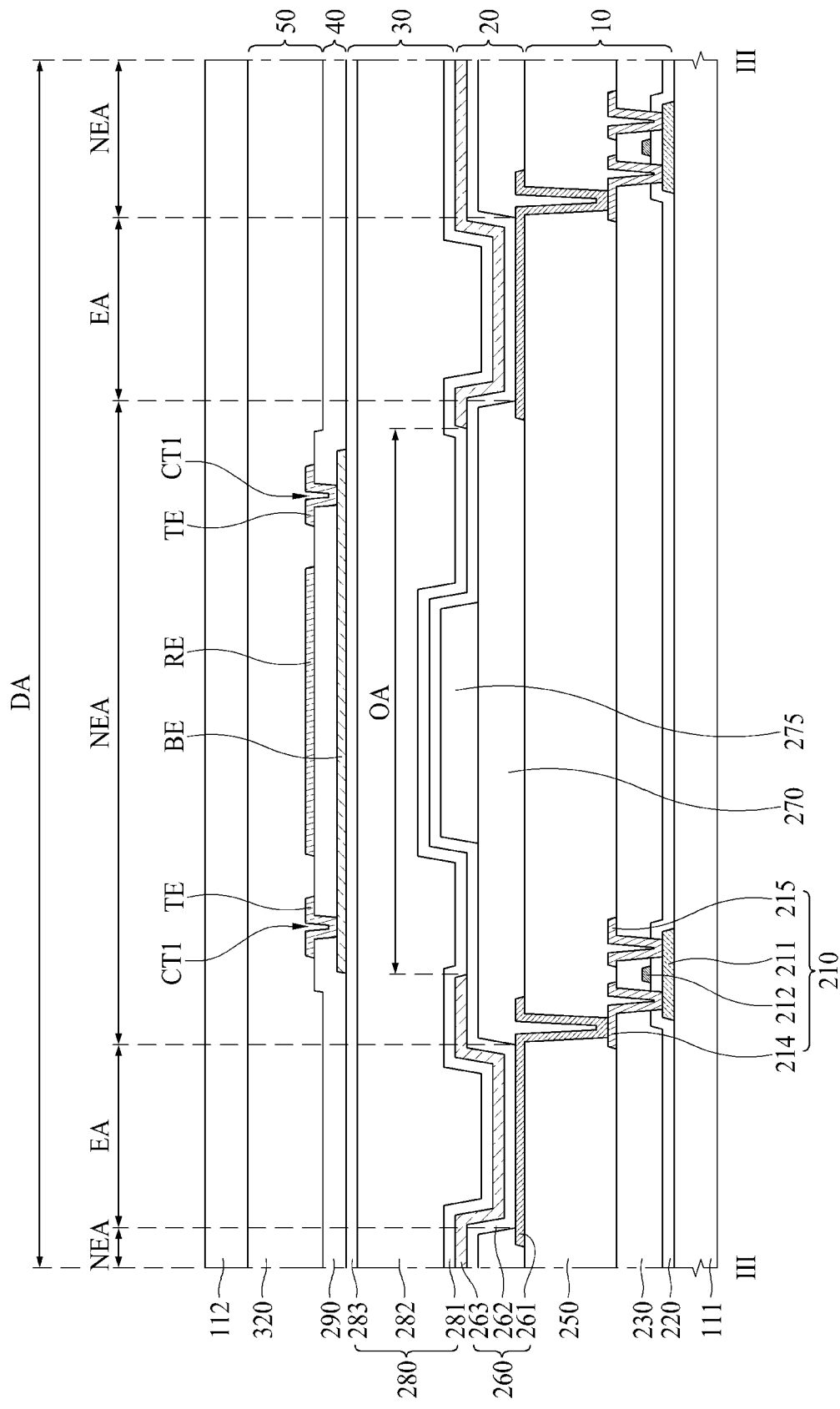
FIG. 11 is a sectional view illustrating another example taken along line III-III in FIG. 5 according to an embodiment of the present disclosure.
Figure 12:
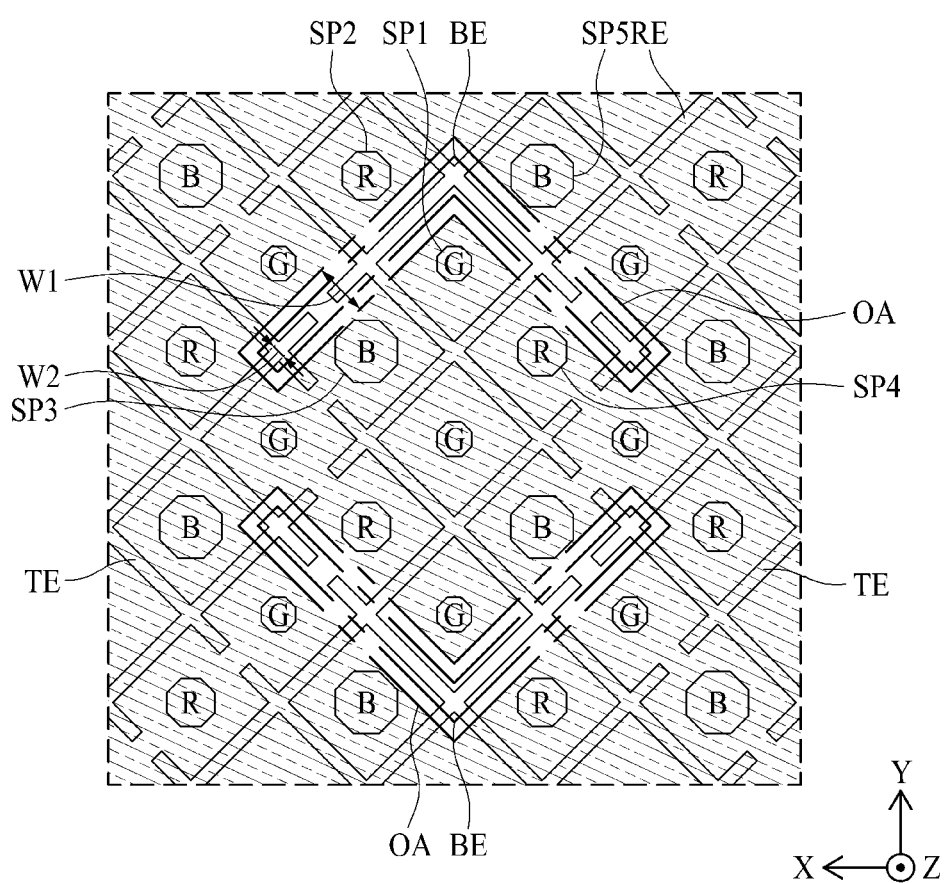
FIG. 12 is a plan view schematically illustrating an example of opening areas of second electrodes illustrated in FIG. 11.

FIG. 11 is a sectional view illustrating a second example taken along line III-III in FIG. 4. FIG. 12 is a plan view schematically illustrating an example of opening areas of second electrodes illustrated in FIG. 11.

A display panel with an embedded touch screen according to a second embodiment of the present disclosure includes a first substrate 111, a second substrate 112, a thin-film transistor layer 10 that is disposed between the first and second substrates 111 and 112, a light emitting element layer 20, an encapsulating layer 30, a touch sensing layer 40, and an adhesive layer 50.

The display panel with an embedded touch screen illustrated in FIGS. 11 and 12 are different from the display panel with an embedded touch screen illustrated in FIGS. 6 to 8 in only the light emitting element layer 20, and the other configurations are substantially the same. Accordingly, specific description of the first substrate 111, the second substrate 112, the thin-film transistor layer 10, the encapsulation layer 30, the touch sensing layer 40, and the adhesive layer 50 will not be repeated in the following description for the sake of brevity.

A light emitting element layer 20 is provided on the thin-film transistor layer 10. The light emitting element layer 20 includes light emitting elements 260, an auxiliary electrode 264, banks 270, and spacers 275. The auxiliary electrode 264, the banks 270, the spacers 275 illustrated in FIGS. 11 and 12 are substantially the same as those in the display panel with an embedded touch screen illustrated in FIGS. 6 to 8. In the following description, specific description of the auxiliary electrodes 264, the banks 270, and the spacers 275 will not be repeated.

The light emitting elements 260, the auxiliary electrode 264, the banks 270, and the spacers 275 are provided on the planarization film 250. Each light emitting element 260 includes a first electrode 261, an organic light emitting layer 262, and a second electrode 263. The first electrode 261 is an anode electrode and the second electrode 263 is a cathode electrode.

Each subpixel SP refers to an area in which the first electrode 261 corresponding to the anode electrode, the organic light emitting layer 262, and the second electrode 263 corresponding to the cathode electrode are sequentially stacked and holes from the first electrode 261 and electrons from the second electrode 263 are combined in the organic light emitting layer 262 to emit light.

The first electrode 261 is provided on the planarization film 250 for each pixel SP. The first electrode 261 is connected to the thin-film transistor 210. Specifically, the first electrode 261 is connected to the source electrode 214 or the drain electrode 215 of the thin-film transistor 210 via a contact hole penetrating the planarization film 250 and is supplied with a voltage for emitting light.

The first electrode 261 is formed of a conductive material having high reflectance such as a stacked structure (Ti/Al/Ti) of aluminum and titanium, a stacked structure (ITO/Al/ITO) of aluminum and ITO, an Ag alloy, or a stacked structure (ITO/Ag alloy/ITO) of an Ag alloy and ITO. The Ag alloy may be an alloy of silver (Ag), palladium (Pd), and copper (Cu).

The organic light emitting layer 262 is provided on the first electrode 261, the bank 270, and the spacer 275. The organic light emitting layer 262 includes a hole transporting layer, at least one light emitting layer, and an electron transporting layer. In this case, when a voltage is applied to the first electrode 261 and the second electrode 263, holes and electrons move to the light emitting layer via the hole transporting layer and the electron transporting layer, respectively, and are combined in the light emitting layer to emit light.

The organic light emitting layer 262 may be a white light emitting layer that emits white light. In this case, the organic light emitting layer 262 may be a common layer which is provided commonly to the subpixels SP. The organic light emitting layer 262 may be formed in a tandem structure of two stacks or more. Each stack may include a hole transporting layer, at least one light emitting layer, and an electron transporting layer.

The organic light emitting layer 262 includes a red light emitting layer that emits red light, a green light emitting layer that emits green light, and a blue light emitting layer that emits blue light. The red light emitting layer, the green light emitting layer, and the blue light emitting layer can be pattern-formed on the first electrode 261 for each subpixel SP. For example, a red light emitting layer is pattern-formed in a red pixel R, a green light emitting layer is pattern-formed in a green pixel G, and a blue light emitting layer is pattern-formed in a blue pixel B, but the present disclosure is not limited thereto.

Alternatively, the organic light emitting layer 262 may be a white light emitting layer that emits white light. In this case, the organic light emitting layer 262 may be a common layer which is provided commonly to the subpixels SP. The organic light emitting layer 262 may be formed in a tandem structure of two stacks or more. Each stack may include a hole transporting layer, at least one light emitting layer, and an electron transporting layer.

A charge generating layer may be provided between the stacks. The charge generating layer includes an n-type charge generating layer that is located adjacent to a lower stack and a p-type charge generating layer that is formed on the n-type charge generating layer and is located adjacent to an upper stack. The n-type charge generating layer injects electrons to the lower stack, and the p-type charge generating layer injects holes to the upper stack. The n-type charge generating layer may be formed of an organic layer which is obtained by doping an organic host material with an alkali metal such as Li, Na, K, or Cs or an alkali earth metal such as Mg, Sr, Ba, or Ra. The p-type charge generating layer may be formed of an organic layer which is obtained by doping an organic host material having hole transportability with a dopant.

The second electrode 263 is provided on the organic light emitting layer 262. The second electrode 263 may be a common layer which is provided commonly to the pixels P.

In the second electrode 263, an opening area OA that exposes a part of the spacer 275 and the bank 270 is provided in the non-emission area NEA. The opening area OA is provided to overlap at least one of the first touch electrode TE, the second touch electrode RE, and the connection electrode BE which will be described later.

For example, the opening area OA may be provided to overlap a part of the connection electrode BE as illustrated in FIG. 12. Accordingly, since the second electrode 263 is not provided under the connection electrode BE, it is possible to reduce parasitic capacitance which is provided between the connection electrode BE and the second electrode 263. On the other hand, a magnetic field of the connection electrode BE reaches a surrounding area of the connection electrode BE in addition to the area in which the connection electrode BE is provided. In consideration thereof, in the second electrode 263 according to the second embodiment of the present disclosure, a width W1 of the opening area OA is provided to be larger than a width W2 of the connection electrode BE. That is, the open area OA of the second electrode 263 has a greater area than the area in which the connection electrode BE is provided. Accordingly, it is possible to minimize parasitic capacitance which is provided between the connection electrode BE and the second electrode 263.

In FIG. 12, the opening area OA overlaps the connection electrode BE, but is not limited thereto. When the connection electrode BE is provided under the first touch electrode TE and the second touch electrode RE, the opening area OA of the second electrode 263 is provided to overlap the connection electrode BE as illustrated in FIG. 12. In this case, the connection electrode BE is closer to the second electrode 263 than the first touch electrode TE and the second touch electrode RE.

For example, when the connection electrode BE is provided over the first touch electrode TE and the second touch electrode RE, the opening area OA of the second electrode 263 is provided to overlap the first touch electrode TE and the second touch electrode RE. In this case, the first touch electrode TE and the second touch electrode RE are closer to the second electrode 263 than the connection electrode BE.

That is, the opening area OA of the second electrode 263 can be provided to overlap an electrode which is provided closer to the second electrode 263.

For example, the opening area OA of the second electrode 263 may be provided to overlap the first touch electrode TE, the second touch electrode RE, and the connection electrode BE. Parasitic capacitance can be provided between an electrode which is provided farther from the second electrode 263 and the second electrode 263. By forming the opening area OA of the second electrode 263 to overlap the first touch electrode TE, the second touch electrode RE, and the connection electrode BE, it is possible to minimize parasitic capacitance which is provided between the electrodes of the touch sensing layer 40 and the second electrode 263.

The opening area OA may have a line-shaped pattern as illustrated in FIG. 12. In this case, the second electrodes 263 provided in the subpixels SP should be electrically connected to each other.

Specifically, the second electrode 263 provided in one subpixel SP is connected to the second electrodes 263 provided in the subpixels SP adjacent thereto.

For example, a second subpixel SP2, a third subpixel SP3, a fourth subpixel SP4, and a fifth subpixel SP5 may be disposed adjacent to a first subpixel SP1 illustrated in FIG. 12. The second electrode 263 provided in the first subpixel SP1 and the second electrode 263 provided in the second subpixel SP2 are not connected to each other because an opening area OA is provided therebetween. The second electrode 263 provided in the first subpixel SP1 and the second electrode 263 provided in the fifth subpixel SP5 are not connected to each other because an opening area OA is provided therebetween. On the other hand, the second electrode 263 provided in the first subpixel SP1 and the second electrode 263 provided in the third subpixel SP3 are connected to each other because an opening area OA is not provided therebetween. The second electrode 263 provided in the first subpixel SP1 and the second electrode 263 provided in the fourth subpixel SP4 are connected to each other because an opening area OA is not provided therebetween. In this way, the second electrodes 263 provided in the subpixels SP are connected to the second electrode 263 that is provided in at least one subpixel SP out of the neighboring subpixels SP. Accordingly, since the second electrodes 263 provided in the subpixels SP are electrically connected to each other, it is not necessary to supply a signal to the second electrode 263 for each subpixel SP.

The second electrode 263 can be formed of a transparent conductive material (TCO) such as ITO or IZO that can transmit light or a semi-transmissive conductive material such as magnesium (Mg), silver (Ag), or an alloy of magnesium (Mg) and silver (Ag). When the second electrode 263 is formed of a semi-transmissive conductive material, emission efficiency can be increased by micro cavities. A capping layer may be provided on the second electrode 263.

While embodiments of the present disclosure have been described above in detail in conjunction with the accompanying drawings, the present disclosure is not limited to the embodiments and can be modified and implemented in various forms without departing from the technical spirit of the present disclosure. Accordingly, the embodiments disclosed in the present disclosure are not for limiting the technical spirit of the present disclosure but for explaining it, and the scope of the technical spirit of the present disclosure is not limited by the embodiments. Therefore, the above-mentioned embodiments should be understood to be exemplary, not definitive, in all respects. The scope of the present disclosure should be defined by the appended claims, and all the technical spirits in equivalent ranges thereof should be construed to belong to the scope of the present disclosure.

What is claimed is:

1. A display panel with an embedded touch screen, comprising:
    a light emitting element layer disposed on a first substrate including an emission area and a non-emission area, and including a first electrode disposed in the emission area on the first substrate, a light emitting layer disposed on an upper surface of the first electrode, and a second electrode having an opening area provided in a part of the non-emission area of the first substrate and being disposed on the light emitting layer;
    a planarization film between the first electrode and the first substrate, and having a flat surface;
    a bank disposed on the flat surface of the planarization film and the first electrode in the non-emission area, and being in direct contact with at least a part of the upper surface of the first electrode to cover an end of the first electrode;
    an encapsulation layer disposed on the light emitting element layer and the bank; and
    a touch sensing layer disposed on the encapsulation layer, the touch sensing layer including first touch electrodes that are arranged in a first direction, second touch electrodes that are arranged in a second direction crossing the first direction, and a connection electrode that electrically connects the first touch electrodes to each other,
        wherein the opening area of the second electrode is disposed between a lower surface of the connection electrode and an upper surface of the bank, and overlaps at least one part of the connection electrode and the bank.

2. The display panel with an embedded touch screen according to claim 1, wherein the touch sensing layer further includes:
first touch lines, via which the first touch electrodes are supplied with a touch driving signal; and
second touch lines, via which charge changes of touch sensors in the display panel are output.

3. The display panel with an embedded touch screen according to claim 1, wherein the first touch electrodes and the second touch electrodes are formed in a mesh structure to prevent overlap with pixels in the display panel.

4. The display panel with an embedded touch screen according to claim 1, wherein the opening area of the second electrode overlaps at least one part of at least one electrode of the first touch electrodes, and the second touch electrodes.

5. The display panel with an embedded touch screen according to claim 4, wherein the opening area of the second electrode has a width greater than a width of the at least one electrode which is overlapped.

6. The display panel with an embedded touch screen according to claim 1, wherein the first touch electrodes and the second touch electrodes are provided in a same layer and the connection electrode is provided in a layer different from the layer in which the first touch electrodes and the second touch electrodes are provided.

7. The display panel with an embedded touch screen according to claim 6, further comprising a touch insulating film that is disposed between the first touch electrodes and the second touch electrodes and the connection electrode,
wherein each of the first touch electrodes is connected to the connection electrode via a contact hole that penetrates the touch insulating film and exposes the connection electrode.

8. The display panel with an embedded touch screen according to claim 1, wherein the opening area of the second electrode overlaps an area in which the connection electrode is provided.

9. The display panel with an embedded touch screen according to claim 8, wherein the opening area of the second electrode has an area greater than the area in which the connection electrode is provided,
wherein the second electrode does not overlap the connection electrode.

10. The display panel with an embedded touch screen according to claim 1, wherein the opening area of the second electrode is formed as a plurality of circular patterns or a plurality of polygonal patterns.

11. The display panel with an embedded touch screen according to claim 1, wherein the second electrode is formed of a transmissive conductive material or a semi-transmissive conductive material.

12. The display panel with an embedded touch screen according to claim 1, wherein
the first substrate includes a display area including the emission area and the non-emission area and a non-display area surrounding the display area, and
the light emitting element layer further comprises an auxiliary electrode that is disposed in the non-display area and is electrically connected to the second electrode.

13. The display panel with an embedded touch screen according to claim 12, wherein the auxiliary electrode is provided in the same layer as the first electrode and is electrically insulated from the first electrode.

14. The display panel with an embedded touch screen according to claim 12, wherein the encapsulation layer comprises an encapsulation film and a dam, the encapsulation film being disposed on the second electrode, the auxiliary electrode, and the dam, the dam disposed in the non-display area to surround the display area.

15. The display panel with an embedded touch screen according to claim 14, wherein the encapsulation film includes a first inorganic film that is disposed on the second electrode, an organic film that is disposed on the first inorganic film, and a second inorganic film that is disposed on the organic film, and
wherein the dam is configured to block a flow of the organic film.

16. The display panel with an embedded touch screen according to claim 15, wherein the dam includes a first dam and a second dam, the first dam formed to surround an outer periphery of the display area and primarily block a flow of the organic film, the second dam formed outside of the first dam and secondarily blocking the flow of the organic film flowing outward over the first dam.

17. The display panel with an embedded touch screen according to claim 14, wherein the auxiliary electrode is disposed between the display area and the dam.

18. The display panel with an embedded touch screen according to claim 17, wherein the auxiliary electrode overlaps a part of the dam below the dam.

19. The display panel with an embedded touch screen according to claim 17, further comprising a thin-film transistor layer that is formed between the first substrate and the organic light emitting element layer.

20. The display panel with an embedded touch screen according to claim 19, further comprising a second substrate covering the first substrate including the emission area and the non-emission area.

21. The display panel with an embedded touch screen according to claim 20, further comprising an adhesive layer that bonds the first substrate to the second substrate.

22. A display device, comprising:
a display panel with an embedded touch screen according to claim 1;
a touch driving unit for supplying drive pulses to the display panel and sensing charge changes of touch sensors of the display panel; and
a touch coordinate calculating unit that is supplied with touch raw data from the touch driving unit and calculates touch coordinates based on the touch raw data.

* * * * *